United States Patent
Scheuerlein

(10) Patent No.: US 7,812,335 B2
(45) Date of Patent: Oct. 12, 2010

(54) SIDEWALL STRUCTURED SWITCHABLE RESISTOR CELL

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 52 days.

(21) Appl. No.: 12/216,110

(22) Filed: Jun. 30, 2008

(65) Prior Publication Data

US 2009/0256129 A1 Oct. 15, 2009

Related U.S. Application Data

(60) Provisional application No. 61/071,093, filed on Apr. 11, 2008.

(51) Int. Cl.
*H01L 47/00* (2006.01)
(52) U.S. Cl. .................. 257/4; 257/E29.001; 438/133
(58) Field of Classification Search .................. 257/3, 257/4, 328; 438/131
See application file for complete search history.

(56) References Cited

U.S. PATENT DOCUMENTS

| | | |
|---|---|---|
| 4,646,266 A | 2/1987 | Ovshinsky et al. |
| 4,665,428 A | 5/1987 | Hockley et al. |
| 5,166,760 A | 11/1992 | Mori |
| 5,432,729 A | 7/1995 | Carson et al. |
| 5,559,732 A | 9/1996 | Birge |
| 5,693,556 A | 12/1997 | Cleeves |
| 5,745,407 A | 4/1998 | Levy et al. |
| 5,751,012 A | 5/1998 | Wolstenholme et al. |
| 5,835,396 A | 11/1998 | Zhang |
| 5,915,167 A | 6/1999 | Leedy |
| 5,962,911 A | 10/1999 | Manley |
| 5,991,193 A | 11/1999 | Gallagher et al. |
| 6,014,330 A | 1/2000 | Endoh et al. |
| 6,034,882 A | 3/2000 | Johnson et al. |
| 6,055,180 A | 4/2000 | Gudesen et al. |
| 6,111,784 A | 8/2000 | Nishimura et al. |

(Continued)

FOREIGN PATENT DOCUMENTS

EP 1 450 373 8/2004

(Continued)

OTHER PUBLICATIONS

International Search Report received in International Application No. PCT/US2009/039126 mailed Jul. 30, 2009.

(Continued)

*Primary Examiner*—Thanh V Pham
*Assistant Examiner*—Mark A Laurenzi, III
(74) *Attorney, Agent, or Firm*—The Marbury Law Group PLLC

(57) ABSTRACT

A method of making a memory device includes forming a first conductive electrode, forming an insulating structure over the first conductive electrode, forming a resistivity switching element on a sidewall of the insulating structure, forming a second conductive electrode over the resistivity switching element, and forming a steering element in series with the resistivity switching element between the first conductive electrode and the second conductive electrode, wherein a height of the resistivity switching element in a first direction from the first conductive electrode to the second conductive electrode is greater than a thickness of the resistivity switching element in second direction perpendicular to the first direction.

8 Claims, 9 Drawing Sheets

U.S. PATENT DOCUMENTS

| | | |
|---|---|---|
| 6,187,617 B1 | 2/2001 | Gauthier et al. |
| 6,236,587 B1 | 5/2001 | Gudesen et al. |
| 6,306,718 B1 | 10/2001 | Singh et al. |
| 6,420,215 B1 | 7/2002 | Knall et al. |
| 6,483,736 B2 | 11/2002 | Johnson et al. |
| 6,486,065 B2 | 11/2002 | Vyvoda et al. |
| 6,525,953 B1 | 2/2003 | Johnson |
| 6,541,312 B2 | 4/2003 | Cleeves et al. |
| 6,548,313 B1 | 4/2003 | Ravi et al. |
| 6,567,301 B2 | 5/2003 | Anthony et al. |
| 6,574,130 B2 | 6/2003 | Segal et al. |
| 6,584,029 B2 | 6/2003 | Tran et al. |
| 6,677,220 B2 | 1/2004 | Van Brocklin et al. |
| 6,686,646 B2 * | 2/2004 | Lee ............................. 257/530 |
| 6,693,823 B2 | 2/2004 | Brown |
| 6,706,402 B2 | 3/2004 | Rueckes et al. |
| 6,777,773 B2 | 8/2004 | Knall |
| 6,815,704 B1 | 11/2004 | Chen |
| 6,834,008 B2 | 12/2004 | Rinerson et al. |
| 6,847,544 B1 | 1/2005 | Smith et al. |
| 6,853,049 B2 | 2/2005 | Herner |
| 6,873,543 B2 | 3/2005 | Smith et al. |
| 6,879,508 B2 | 4/2005 | Tran |
| 6,881,994 B2 | 4/2005 | Lee et al. |
| 6,946,719 B2 | 9/2005 | Petti et al. |
| 6,951,780 B1 | 10/2005 | Herner |
| 6,952,030 B2 | 10/2005 | Herner et al. |
| 6,952,043 B2 | 10/2005 | Vyvoda et al. |
| 6,999,366 B2 | 2/2006 | Perner et al. |
| 7,038,248 B2 | 5/2006 | Lee |
| 7,071,008 B2 | 7/2006 | Rinerson et al. |
| 7,081,377 B2 | 7/2006 | Cleeves |
| 7,113,426 B2 | 9/2006 | Rueckes et al. |
| 7,126,855 B2 | 10/2006 | Honda et al. |
| 7,172,840 B2 | 2/2007 | Chen |
| 7,176,064 B2 | 2/2007 | Herner |
| 7,180,815 B2 | 2/2007 | Fujiu et al. |
| 7,224,013 B2 | 5/2007 | Herner et al. |
| 7,283,403 B2 | 10/2007 | Johnson |
| 7,307,013 B2 | 12/2007 | Raghuram et al. |
| 7,345,907 B2 | 3/2008 | Scheuerlein |
| 7,474,000 B2 | 1/2009 | Scheuerlein et al. |
| 7,492,630 B2 | 2/2009 | Scheuerlein |
| 7,511,352 B2 | 3/2009 | Vyvoda |
| 7,575,984 B2 | 8/2009 | Radigan et al. |
| 2004/0016991 A1 | 1/2004 | Johnson et al. |
| 2004/0033189 A1 | 2/2004 | Kaschak et al. |
| 2004/0228159 A1 | 11/2004 | Kostylev et al. |
| 2004/0232509 A1 | 11/2004 | Vyvoda et al. |
| 2005/0012119 A1 | 1/2005 | Herner et al. |
| 2005/0052915 A1 | 3/2005 | Herner et al. |
| 2005/0098800 A1 | 5/2005 | Herner et al. |
| 2005/0121742 A1 | 6/2005 | Petti et al. |
| 2005/0221200 A1 | 10/2005 | Chen |
| 2005/0226067 A1 | 10/2005 | Herner et al. |
| 2006/0087005 A1 | 4/2006 | Herner |
| 2006/0108667 A1 | 5/2006 | Lung |
| 2006/0141679 A1 | 6/2006 | Subramanian et al. |
| 2006/0250836 A1 | 11/2006 | Herner et al. |
| 2006/0250837 A1 | 11/2006 | Herner et al. |
| 2007/0008773 A1 | 1/2007 | Scheuerlein |
| 2007/0029546 A1 | 2/2007 | Cho et al. |
| 2007/0070690 A1 * | 3/2007 | Scheuerlein et al. ......... 365/171 |
| 2007/0111429 A1 * | 5/2007 | Lung ......................... 438/238 |
| 2007/0164309 A1 | 7/2007 | Kumar et al. |
| 2007/0284656 A1 * | 12/2007 | Radigan et al. ............. 257/328 |
| 2008/0128853 A1 * | 6/2008 | Choi et al. .................. 257/530 |
| 2008/0237599 A1 | 10/2008 | Herner et al. |
| 2008/0239790 A1 | 10/2008 | Herner et al. |
| 2009/0026434 A1 * | 1/2009 | Malhotra et al. ................ 257/2 |
| 2009/0168492 A1 | 7/2009 | Thorp et al. |
| 2009/0257265 A1 | 10/2009 | Chen et al. |
| 2009/0257266 A1 | 10/2009 | Chen et al. |
| 2009/0258489 A1 | 10/2009 | Chen et al. |

FOREIGN PATENT DOCUMENTS

| | | |
|---|---|---|
| EP | 1 780 814 A2 | 5/2007 |
| EP | 1 816 680 A1 | 8/2007 |
| EP | 2 043 156 A2 | 4/2009 |
| WO | WO 2004/055827 A1 | 7/2004 |

OTHER PUBLICATIONS

International Search Report received in International Application No. PCT/US2009/039120 mailed Aug. 11, 2009.

U.S. Appl. No. 12/007,780, filed Jan. 15, 2008, Herner et al.

U.S. Appl. No. 12/007,781, filed Jan. 15, 2008, Dunton et al.

U.S. Appl. No. 09/560,626, filed Apr. 28, 2000, Knall.

Office Action mailed Oct. 29, 2009, received in U.S. Appl. No. 12/153,874.

Abdi, Y. et al., "PECVD-grown carbon nanotubes on silicon substrates with a nickel-seeded tip-growth structure" Materials Science and Engineering C26, (2006), pp. 1219-1223, vol. 26.

Alavi, M. et al., "A PROM Element Based on Salicide Agglomeration of Poly Fuses in a CMOS Logic Process," IEDM 97, 1997, pp. 855-858.

Amemiya, Y. et al., "Electrical Trimming of Heavily Doped Polycrystalline Silicon Resistors," IEEE Transactions Electron Devices, vol. Ed-26, No. 11, Nov. 1979, pp. 1738-1742.

Babcock, J. A. et al., "Precision Electrical Trimming of Very Low TCR Poly-Sige Resistors," IEEE Electron Device Letters, vol. 21, No. 6, Jun. 2000, pp. 283-285, XP000951962 ISSN: 0741-3106.

Babcock, J. A. et al., "Polysilicon Resistor Trimming for Packaged Integrated Circuits", IEDM 93, 1993, pp. 247-250.

Chiang, S. et al., "Antifuse Structure Comparison for Field Programmable Gate Arrays", IEDM 92-611, Apr. 1992, pp. 24.6.1-24.6.4.

Cui, J. B. et al., "Carbon Nanotube Memory Devices of High Charge Storage Stability," Applied Physics Letters, (2002), vol. 81, No. 17, pp. 3260-3262.

Das, S. et al., "A Large-Bias Conduction Model of Polycrystalline Silicon Films," IEEE Transactions on Electron Devices, vol. 41, No. 4, Apr. 1994, pp. 524-532.

Das, S. et al., "Electrical Trimming of Ion-Beam-Sputtered Polysilicon Resistors by High Current Pulses," IEEE Transactions on Electron Devices, vol. 41, No. 8, Aug. 1994, pp. 1429-1434.

Feldbaumer, D.W. et al., "Theory and Application of Polysilicon Resistor Trimming," Solid-State Electronics, vol. 38, No. 11, Jan. 1995, 1861-1869.

Feldbaumer, D.W., "Pulse Current Trimming of Polysilicon Resistors," IEEE Transactions on Electron Devices, vol. 42, No. 4, Apr. 1995, pp. 689-696.

Hamdy, E. et al., "Dielectric Based Antifuse for Logic and Memory ICs", IEDM 88, 1998, pp. 786-789.

Hatalis, M. et al., "Large Grain Polycrystalline Silicon by Low-Temperature Annealing of Low-Pressure Chemical Vapor Deposited Amorphous Silicon Films", J. Appl. Phys., vol. 63, No. 7, Apr. 1988, pp. 2260-2266.

Herner, S. B. et al., "Polycrystalline silicon/CoSi2 Schottky diode with integrated SiO2 antifuse: a nonvolatile memory cell", Applied Physics Letters, vol. 82, No. 23, Jun. 2003, pp. 4163-4165.

Holloway, Karen et al., "Amorphous Ti-Si alloy formed by interdiffusion of amorphous Si and crystalline Ti multilayers", J. Appl. Phys., vol. 61, No. 4, Feb. 1987, pp. 1359-1364.

Hosoi, Y. et al., "High Speed Unipolar Switching Resistance RAM (RRAM) Technology", IEEE , 2006, 4 pgs.

Kato, K. et al., "A Monolithic 14 Bit D/A Converter Fabricated with a New Trimming Technique (DOT)," IEEE Journal of Solid-State Circuits, vol. SC-19, No. 5, Oct. 1984, pp. 802-804-806.

Kato, K. et al., "A Physical Mechanism of Current-Induced Resistance Decrease in Heavily Doped Polysilicon Resistors," IEEE Transaction on Electron Devices, vol. ED-29, No. 8, Aug. 1982, pp. 1156-1160.

Kato, K. et al., "Change in Temperature Coefficient of Resistance of Heavily Doped Polysilicon Resistors Caused by Electrical Trimming," Jpn. J. Appl. Phys., vol. 35, Part I, No. 8, Aug. 1996, pp. 4209-4215.

Kato, K. et al., "Constant Voltage Trimming of Heavily Doped Polysilicon Resistors," Jpn. J. Appl. Phys., vol. 34, Part 1, No. 1, Jan. 1995, pp. 48-53.

Kim, Tae-Kyun et al., "Oxidation behavior of a patterned TiSi2/polysilicon stack", J. Vac. Sci. Technol. B., vol. 19, No. 2, Mar./Apr. 2001, pp. 366-371.

Konakova, R. V. et al., "Ohmic Contacts for Microwave Diodes", Proc. 22$^{nd}$ International Conference on Microelectronics (MIEL 2000), vol. 2, NIS Serbia, May 14-17, 2000, Jan. 1999, pp. 477-480.

Lane, W. A., "The Design of Thin-Film Polysilicon Resistors for Analog IC Applications," IEEE Transactions on Electron Devices, vol. 36, No. 4, Apr. 1989, pp. 738-744.

Li, Jun et al., Bottom-Up Approach for Carbon Nanotube Interconnects, Applied Physics Letters, (2003), vol. 82, No. 15, pp. 2491-2493.

Mahan, J.E. et al., "Threshold and Memory Switching in Polycrystalline Silicon", Applied Physics Letter, vol. 41, No. 5, Sep. 1982, pp. 479-481.

Malhotra, Vinod et al., "An Electrothermal Model of Memory Switching in Vertical Polycrystalline Silicon Structures", IEEE Transactions of Electron Devices, vol. 35, No. 9, Sep. 1988, pp. 1514-1523.

Meyyappan, M. et al., Carbon nanotube growth by PECVD: a review, Plasma Sources Sci. Technol., (2003), vol. 12, pp. 205-216.

Nozaki, Tomohiro et al., "Fabrication of vertically aligned single-walled carbon nanotubes in atmospheric pressure non-thermal plasma CVD," Carbon, (2007), vol. 45, pp. 364-374.

Rao, A. M. et al., "In situ-grown carbon nanotube array with excellent field emission characteristics," Applied Physics Letters, (2000), vol. 76, No. 25, pp. 3813-3815.

Salonen, E. et al., "Ion-irradiation-induced defects in bundles of carbon nanotubes," Nuclear Instruments and Methods in Physics Research B, (2002), vol. 193, pp. 603-608.

Shih, Chih-Ching et al., "Characterization and Modeling of a Highly Reliable Metal-to-Metal Antifuse for High-Performance and High-Density Field-Programmable Gate Arrays", 1997 IEEE, Sep. 1997, pp. 25-33.

Shin, Young Min et al., Influence of morphology of catalyst thin film on vertically aligned carbon nanotube growth, Journal of Crystal Growth, (2004), pp. 81-89, vol. 271.

Smith, P. et al., "Polishing TiN for Nanotube Synthesis, Proceedings of the 16th Annual Meeting of the American Society for Precision Engineering," (2001), Crystal City, VA.

Tang, Qiang et al., "Twinning in TiSi2-island catalyzed Si nanowires grown by gas-source molecular-beam epitaxy", Applied Physics Letters, vol. 81, No. 13, Sep. 2002, pp. 2451-2453.

Tobita, Toshio, "New Trimming Technology of a Thick Film Resistor by the Pulse Voltage Method," IEEE Transactions on Components, Hybrids and Manufacturing Technology, vol. 14, No. 3, Sep. 1991, pp. 613-617.

Tung, R. T., "Oxide mediated epitaxy of CoSi2 on silicon", Appl. Phys. Lett., vol. 68, No. 24, Jun. 1996, pp. 3461-3463.

Wang, Shoue-Jen et al., "High-Performance Metal/Silicide Antifuse", IEEE Electron Device Letters, vol. 13, No. 9, Sep. 1992, pp. 471-472.

Wen, Hua-Chiang et al., Effects of ammonia plasma treatment on the surface characteristics of carbon fibers, Surface & Coatings Technology, (2006), pp. 3166-3169, vol. 200.

Office Action mailed Feb. 17, 2010 received in U.S. Appl. No. 12/153,874.

Lemme et al., "Mobility in Graphene Double Gate Field Effect Transistors," Solid State Electronics, vol. 52, No. 4, 2008, pp. 514-518.

Li et al., "Processable Aqueous Dispersions of Graphene Nanosheets," Nature Nanotechnology, vol. 3, No. 2, 2008, pp. 101-105.

* cited by examiner

Side view
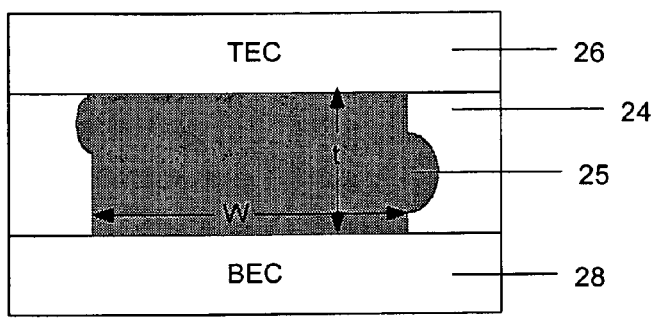
Top view
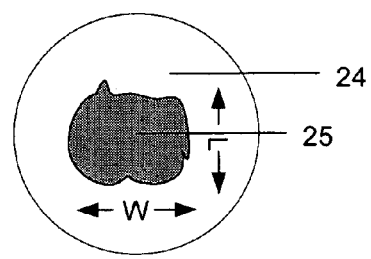
Figure 1B
Prior Art
Figure 1C
Prior Art

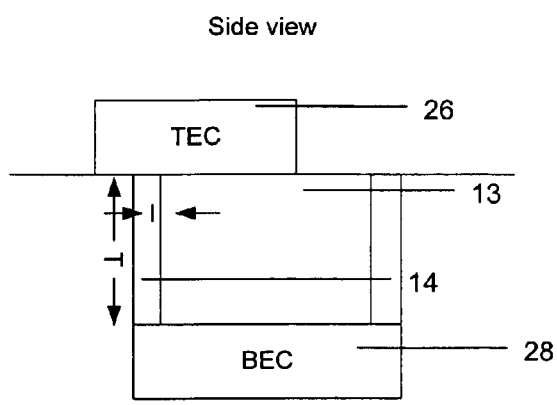
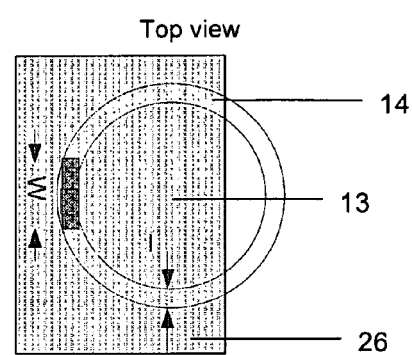
Figure 2A                    Figure 2B

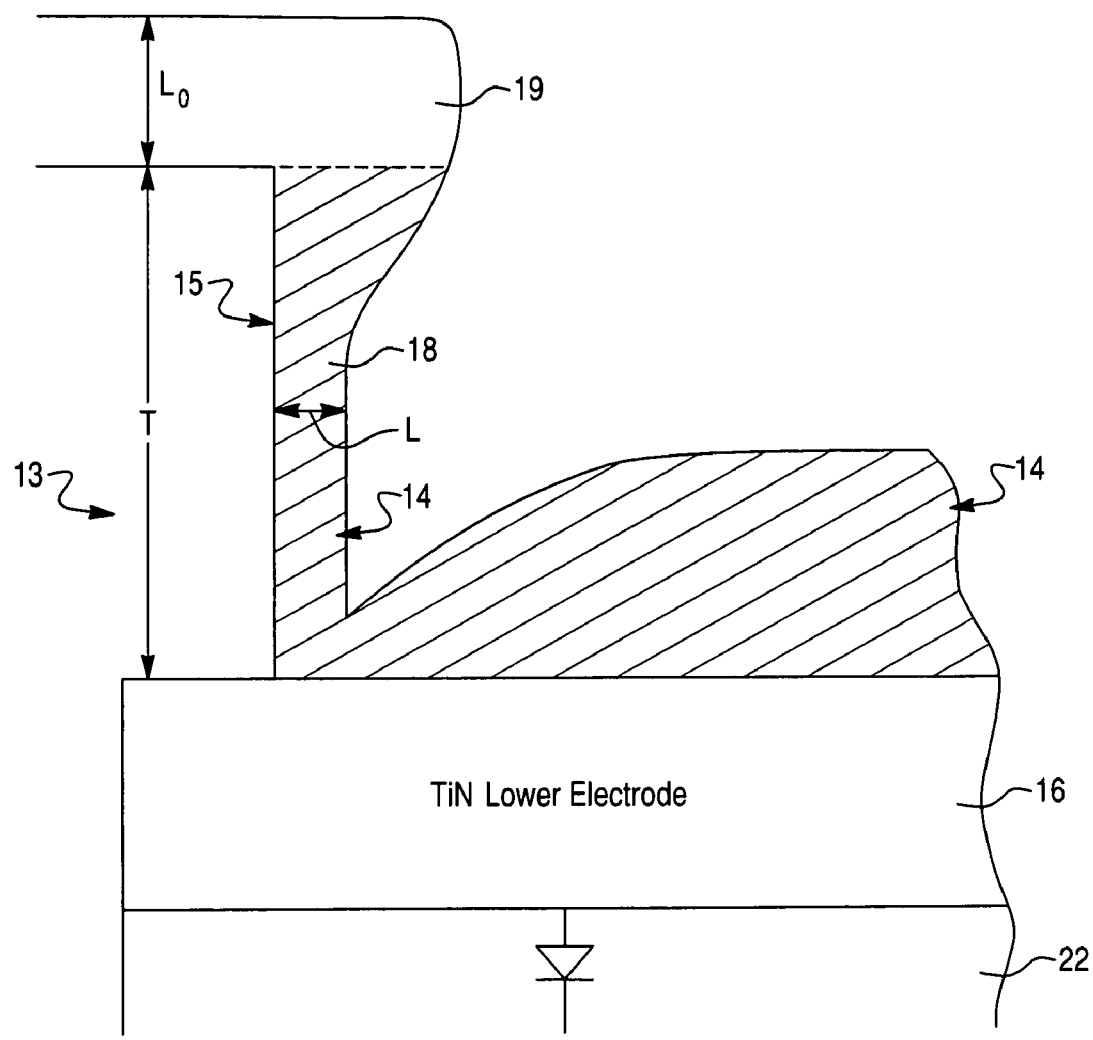

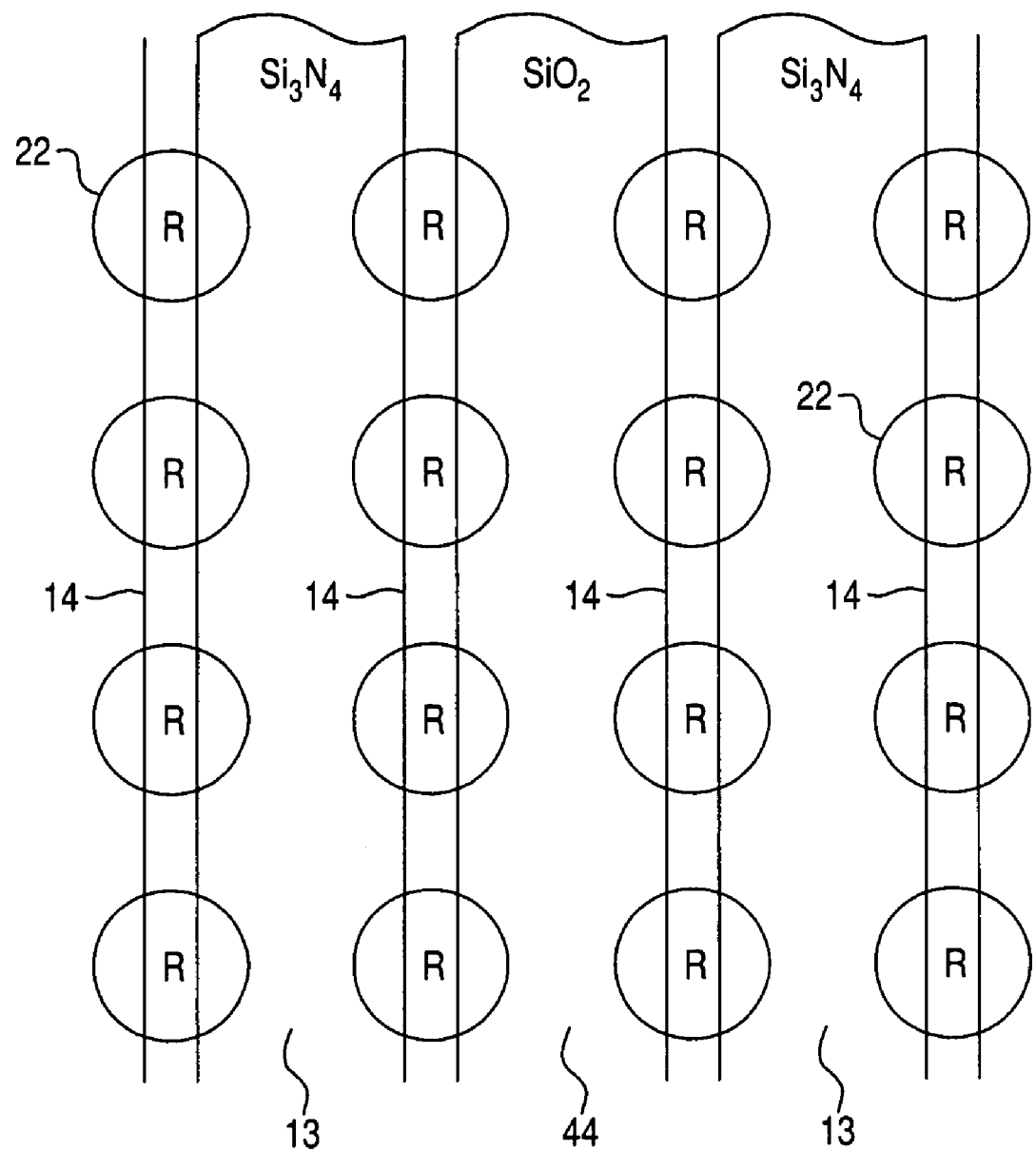

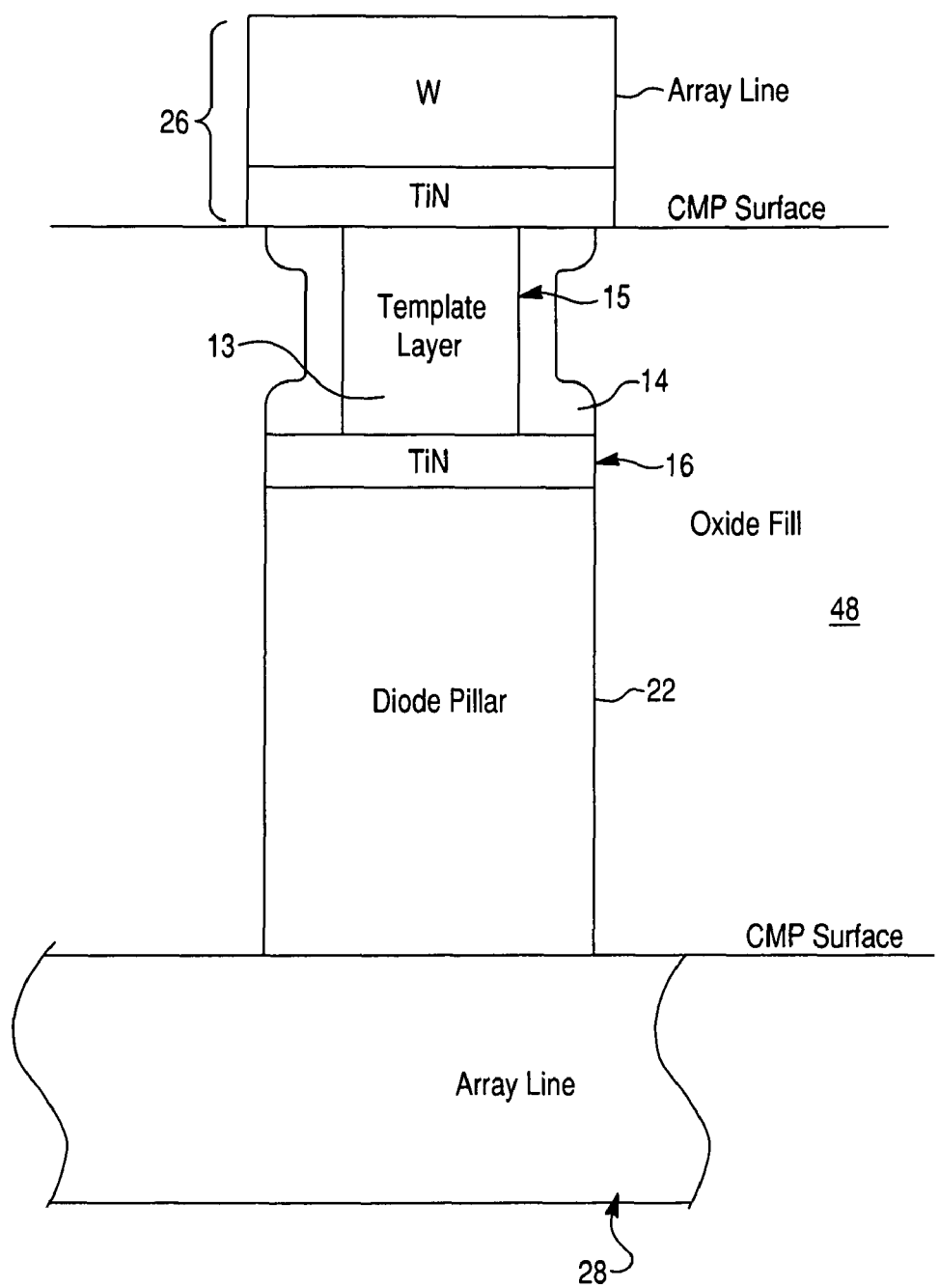

SIDEWALL STRUCTURED SWITCHABLE RESISTOR CELL

The present application claims benefit of priority of U.S. Provisional Application Ser. No. 61/071,093, filed Apr. 11, 2008, which is hereby incorporated by reference in its entirety.

BACKGROUND

The invention generally relates to a method of making a semiconductor device, and more particularly, to a method of making a semiconductor nonvolatile memory cell.

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is a primary motivation in the designing of such circuits.

FIG. 1 illustrates an exemplary prior art memory cell 20 which includes a vertically oriented, cylindrical pillar shaped junction diode 22 as the steering element of the cell and a storage element 24, such as an antifuse dielectric or a metal oxide resistivity switching layer. The diode 22 and the storage element 24 are interposed between top 26 and bottom 28 conductors or electrodes. The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the storage element 24 are arranged in series between the bottom conductor 28 and the top conductor 26, which may be formed of a metal, such as tungsten and/or TiN. The storage element 24 may be located above or below the diode 22. Referring to FIG. 1A, U.S. Pat. No. 6,952,030, issued to Herner et al. and entitled "High-Density Three-Dimensional Memory Cell," hereinafter the "'030 patent" and hereby incorporated by reference in its entirety, discloses an exemplary nonvolatile memory cell.

The resistance of metal oxide switchable resistors can be too low to be efficiently sensed by a three dimensional (3D) diode array. A low reset current is generally preferable to a high reset current, and thus the resistance of the resistor element is generally preferred to be high. Because the metal oxide element 24 is disposed over a diode pillar 22, the resistance of the oxide element can be too low, thereby giving rise to an undesirably high reset current. Furthermore, the metal oxide resistor material can be damaged as a result of etching during fabrication and thus fails to provide switching function.

SUMMARY

A method of making a memory device includes forming a first conductive electrode, forming an insulating structure over the first conductive electrode, forming a resistivity switching element on a sidewall of the insulating structure, forming a second conductive electrode over the resistivity switching element, and forming a steering element in series with the resistivity switching element between the first conductive electrode and the second conductive electrode, wherein a height of the resistivity switching element in a first direction from the first conductive electrode to the second conductive electrode is greater than a thickness of the resistivity switching element in second direction perpendicular to the first direction.

BRIEF DESCRIPTION OF THE DRAWINGS

FIGS. 1B and 1C show the side view and top view, respectively, of the resistivity switching storage element of the prior art cell.

FIGS. 2A and 2B show the side view and top view, respectively of a cell according to an embodiment of the invention.

FIGS. 3, 4, 5, 6A and 7 illustrate side cross sectional views of memory cells according to embodiments of the invention. FIG. 6B is a top view of the cell of FIG. 6A.

DETAILED DESCRIPTION OF THE EMBODIMENTS

Figure 1A:
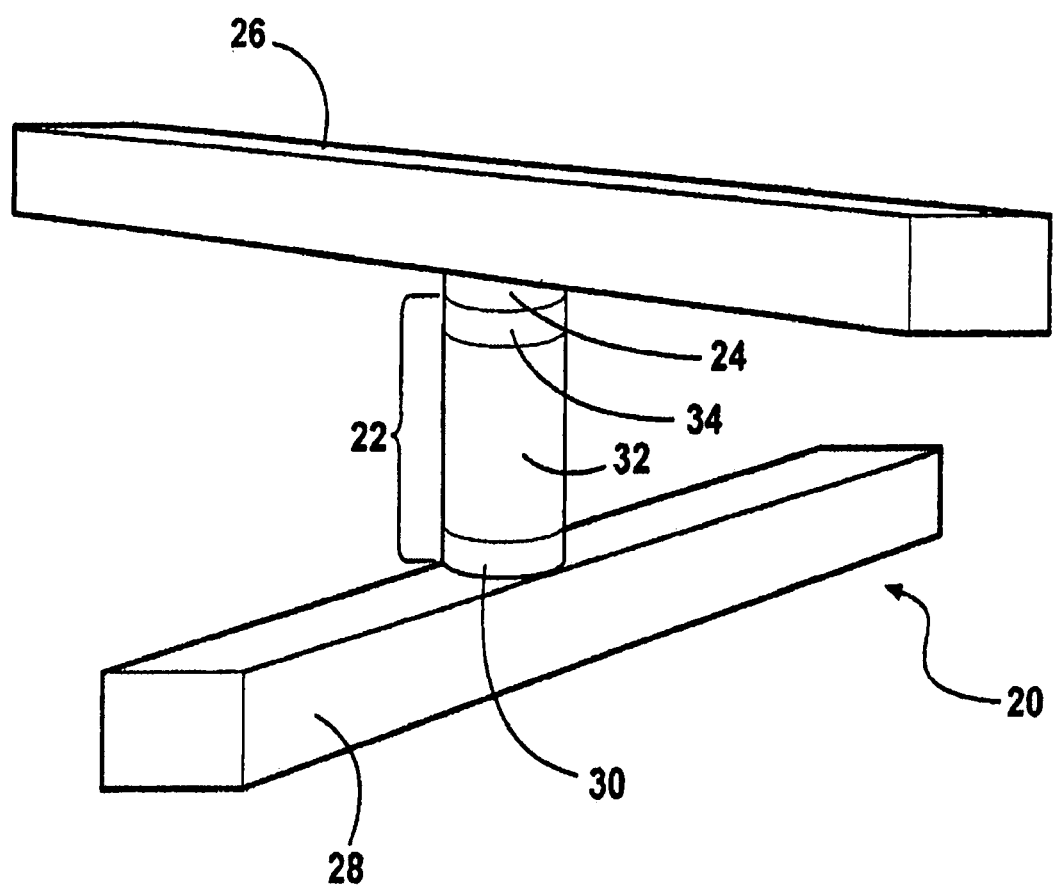
FIG. 1A illustrates a three dimensional view of a prior art memory cell.

The present inventor recognized that the resistance of the storage element, which is also referred to as a resistivity switching element herein, can be increased by a geometry effect, where the resistivity switching element is formed on a sidewall of the insulating structure in series with the steering element. In this configuration, the height of the resistivity switching element in a "vertical" direction from the bottom conductive electrode to the upper conductive electrode is greater than a thickness of the resistivity switching element in a second direction perpendicular to the "vertical" direction. The resistivity switching element can be a thin layer of binary metal oxide located on the sidewall of an insulating structure and still be provided in series with a diode steering element between the lower and upper electrodes.

The resistance R of a resistivity switching material 24 can be calculated by $$R = \rho * t / (L * W), \quad [1]$$

where $\rho$ is the resistivity of the material, t the height of the layer, (L*W) the area of the conductive path. As a result, the resistance of the layer can be highly dependent on geometry. FIGS. 1B, 1C, 2A and 2B illustrate such dependence of the resistance. FIGS. 1B and 1C illustrate the resistivity switching element 24 located on top of the diode (which is omitted from FIGS. 1B and 1C for clarity but can be located above or below element 24). Since the L*W area of the conductive filament 25 formed during the switching of the element 24 to the low resistivity state is not limited by the structure of the cell, the resistance of the conductive filament may be a relatively low resistance. Typical metal oxide switchable resistance materials may form filaments that have resistance in the 1 K ohm to 10 K ohm range which is lower resistance than typically achieved by diodes formed for use in three dimensional diode arrays. The diodes in three dimensional diode arrays may not reliably reset relatively low resistance filaments.

FIGS. 2A and 2B illustrate side cross sectional and top views of a portion of a memory cell structure according to one embodiment of the invention, where the diode is again omitted for clarity, but which is located above or below and in series with the resistivity switching element 14 between electrodes 26 and 28. In this embodiment, the resistivity switching element 14 is formed on a sidewall of an insulating structure 13. In this configuration, the resistance is calculated by $$R = \rho*T/(l*W) \quad [2]$$

where l is the deposited thickness of element 14 on the sidewall of the insulating structure. Length l can be significantly smaller than length L of FIGS. 1B and 1C. The resistance increases by a factor of (L/l) in the configuration of FIGS. 2A and 2B compared to that of FIGS. 1B and 1C. Height, T, is the height of the resistivity switching element 14 which covers the sidewall of the insulating structure 13. Height T, can be equal to the prior planar thickness, t and in some cases can be greater than planar thickness, t, of FIGS. 1B and 1C.

One advantage of the embodiment of the invention shown in FIGS. 2A and 2B is the increase of the low resistance state which depends on the magnitude of height T. Note that the region that switches to high resistance could be less than T as shown in FIG. 3 for some materials. As can be seen from the above described figures, W tends to be greater than t in the prior art configuration shown in FIGS. 1B and 1C, and less than T in the sidewall configuration of the embodiments of the invention shown in FIGS. 2A and 2B. The thickness of the sidewall layer l can be less than the typical dimension of the filamentary region. Since l can be smaller than the prior art filament diameter, it also tends to reduce the extent of the filament in the W dimension in some materials for further resistance increase.

The resistance of the resistivity switching element in the embodiments of the invention is less dependent on the size of the variable filament formation because it is restricted by the dimension l. Since the cross-sectional area of the current path through the resistivity switching element is restricted to less than the typical filament size in some materials, the reset current will also be lower. Reduced reset current and the associated IR drops in the switch and array lines is a significant advantage in allowing the reset voltage and power to decrease in memory arrays comprising the sidewall resistivity switching elements. The diodes in three dimensional diode arrays may reliably reset the relatively high resistance filaments formed in the embodiments of the invention.

In FIG. 1 the L tends to increase with t and may be about four times t, for example t is 5 nm and L is 20 nm. But in FIG. 2, l is insensitive to T so that T can be increased by process choices; for example, the height, T, of the resistivity switching material layer can be greater than 5 nm, such as greater than 20 nm, and the thickness l can be less than 20 nm, such as less than 5 nm. As a result, the resistance can be increased from that illustrated in FIG. 1 by a factor of (L/l) times (T/t) for an increase of 16 times in this example.

FIGS. 3-7 illustrate exemplary memory cell structures with various insulating structures 13 according to the embodiments of the invention. The resistivity switching element 14 can have different shapes. For example, it can be annular, surrounding the insulating structure or it can be located inside a trench in an insulating material. Similarly, the insulating structure can have different shapes, such as a pillar or rail shape.

As shown in FIG. 3, the pillar diode 22 (shown in detail in FIG. 1A) is formed over the lower electrode 28 (which is also shown in FIG. 1). The diode 22 can made of any suitable semiconductor material, such as silicon, germanium, SiGe or other compound semiconductor materials, which can be polycrystalline, single crystalline, or amorphous. The electrode 28 is located on or over a substrate, such as a semiconductor wafer (including silicon or compound semiconductor wafers), or a glass, plastic or metal substrate. The electrode 28 may comprise a metal such as tungsten, aluminum or their alloys, or a metallic compound, such as titanium nitride.

Then, an optional conductive barrier 16 is formed over the diode 22. The barrier 16 may comprise any conductive material, such as titanium nitride. Then, the insulating structure 13 is formed over the barrier 16. The insulating structure 13 can comprise any suitable insulating material, such as silicon oxide or silicon nitride or an organic insulating material. The structure 13 may have any suitable shape, such as rail or pillar shape, as long as it contains a sidewall 15.

At least one resistivity switching element 14 is then formed on at least one sidewall of the insulating structure 13. If the structure is cylindrical, as shown in FIG. 2B, then it has only one sidewall 15. The resistivity switching element 14 can comprise a fuse, polysilicon memory effect material, a metal oxide (such as binary metal oxide, for example nickel oxide, or a switchable complex metal oxide, such as perovskite oxide), carbon nanotubes, graphene switchable resistance material, other carbon resistivity switching material, such as amorphous, polycrystalline or microcrystalline carbon, phase change materials, electrolyte switching materials, switchable complex metal oxides, conductive bridge elements, or switchable polymers. The resistivity of the resistivity switching element may be increased or decreased in response to a forward and/or reverse bias provided between the electrodes 26 and 28 shown in FIG. 1A.

The resistivity switching element 14 can be formed on the insulating structure 13 by any suitable methods, such as chemical vapor deposition, physical vapor deposition (such as sputtering), etc. The element 14 can be located over the top surface of the insulating structure 13 and on the sidewall 15 of the insulating structure 13. Alternatively, the element 14, such as a metal oxide insulating layer, is formed over the insulating structure 13 and then planarized by CMP or other methods to remove the thickness Lo of element 14 located on the upper surface of the structure 13 and to expose an upper surface of insulating structure 13. As shown in FIG. 3, the active switching region 18 of the element 14 has a length L which may be thinner than the planar thickness of the element due to shadowing effects of PVD deposition. This sidewall necking in region 18 increases the resistance of the element 14.

In an alternative embodiment shown in FIG. 4, a metal or metal nitride film, such as titanium nitride film, is deposited over the structure 13 and subsequently selectively removed from the top of insulating structure by CMP or other planarization methods. The patterned film is then oxidized in an oxidizing ambient thereby forming a metal oxide or oxynitride resistivity switching element 14, for example a titanium oxynitride element. Due to the above described necking, the active region 18 of the element may be completely converted to an insulating metal oxide or oxynitride, while the upper portion 42 of the element 14 may remain as a conductive metal or metal nitride. The thickness of the element 14 is expanded for clarity in FIG. 4. Element 14 may have a vertical thickness of 10 to 30 nm.

Figure 4:
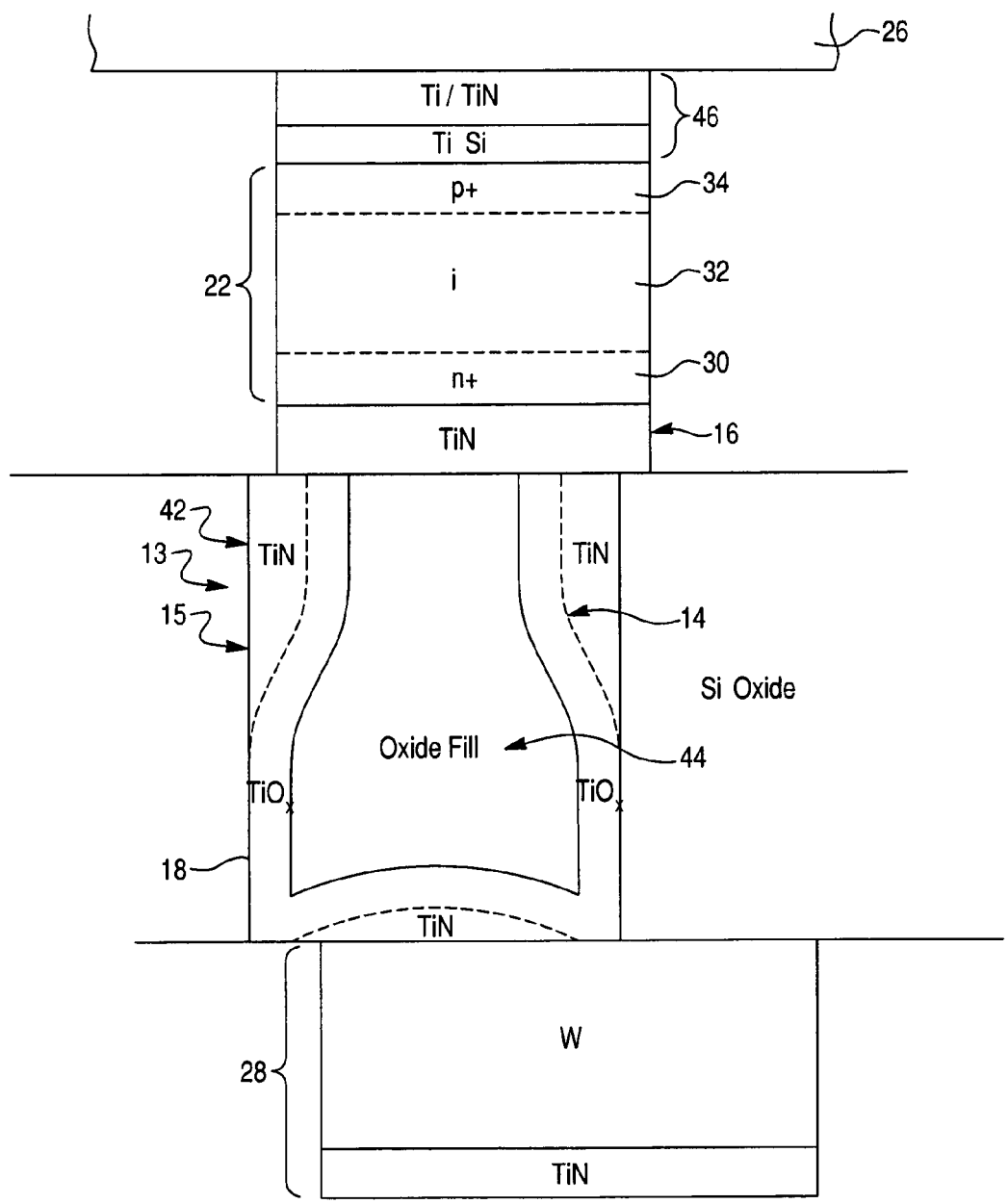

In the embodiment of FIG. 4, the sidewalls 15 of the structure 13 comprise sidewall(s) of a hole or trench 42 formed in an insulating layer 13, such as a silicon oxide layer. The hole or trench exposes the bottom electrode 28 to allow the resistivity switching material to electrically contact the bottom electrode 28. If desired, the groove remaining in the resistivity switching element 14 may be filled with an insulating filler material 44, such as a silicon oxide or organic material, and planarized by CMP or other suitable methods, to expose the upper surface of the element 14.

As shown in FIG. 4, the bottom electrode 28 may comprise a combination of TiN and tungsten layers. Furthermore, as shown FIG. 4, the diode 22 is located above the resistivity switching element 14 and barrier 16. However, the order may be reversed and the diode 22 may be formed below the barrier 16 and element 14. If desired, an upper barrier 46 may be formed between the diode 22 and the upper electrode 26. The upper barrier 46 may comprise a titanium silicide layer, such as a C49 phase titanium silicide layer formed by reacting a titanium layer with the polysilicon material of the diode, and a Ti/TiN bilayer.

As discussed above, the diode 22 acts as a steering element of the cell. For example, the memory cell can include a vertically oriented, cylindrical pillar shaped junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material. In other embodiments, a tunneling diode comprising MIM or MIIM structures may be used.

Figure 5:
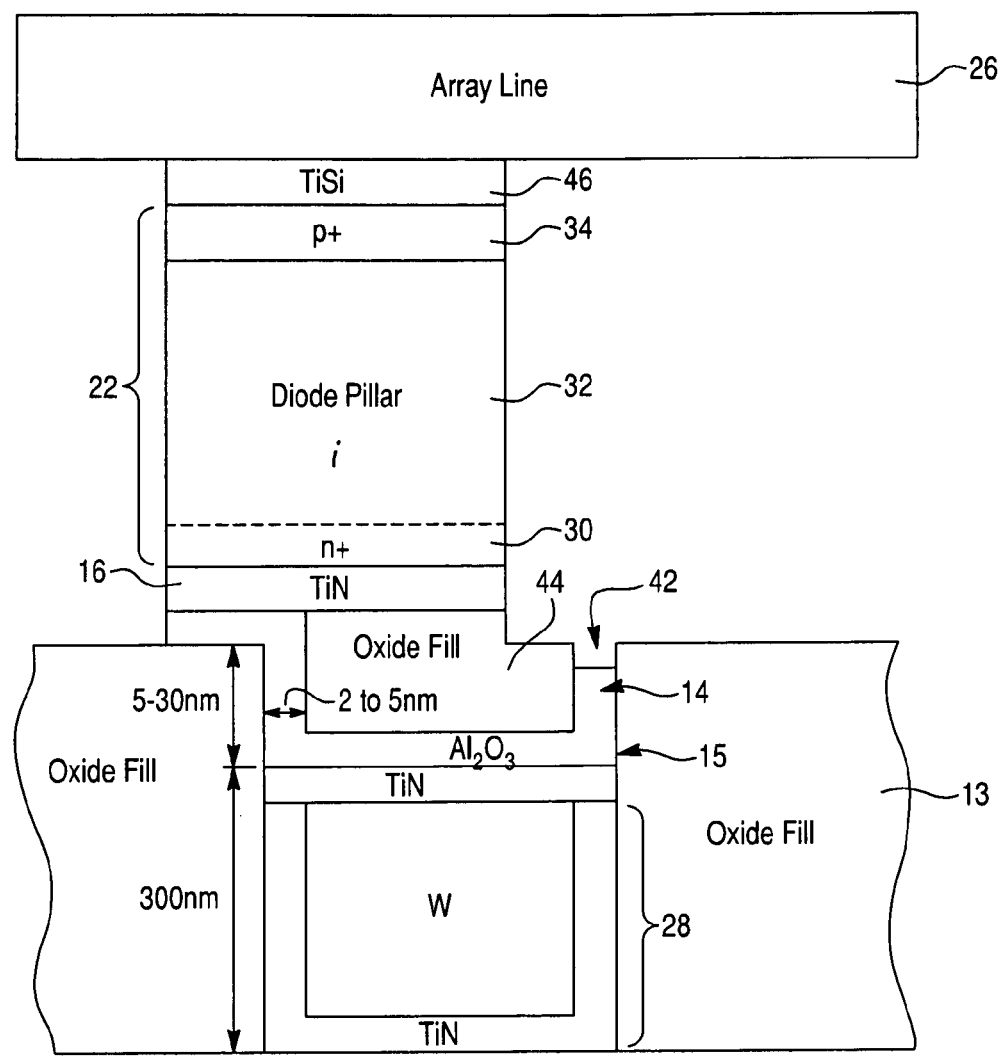

In another alternative embodiment shown in FIG. 5, the resistivity switching element 14 comprises an insulating layer, such as a metal oxide layer (for example $Al_2O_3$) which is deposited in an insulating state inside the hole or trench 42 (instead of oxidizing a conductive layer as shown in FIG. 4). Thus, the element is formed using a Damascene type process. As shown in FIG. 5, the insulating layer which forms the element 14 does not necessarily have to be planarized and can extend over the structure 13. Furthermore, as shown in FIG. 5, the diode 22 may be offset with respect to the element 14 to make sure that element 14 contacts the diode 22. As shown in FIG. 5, the element 14 can be 5-30 nm high, while the electrode 28 may be about 200 nm high.

Figure 6A:
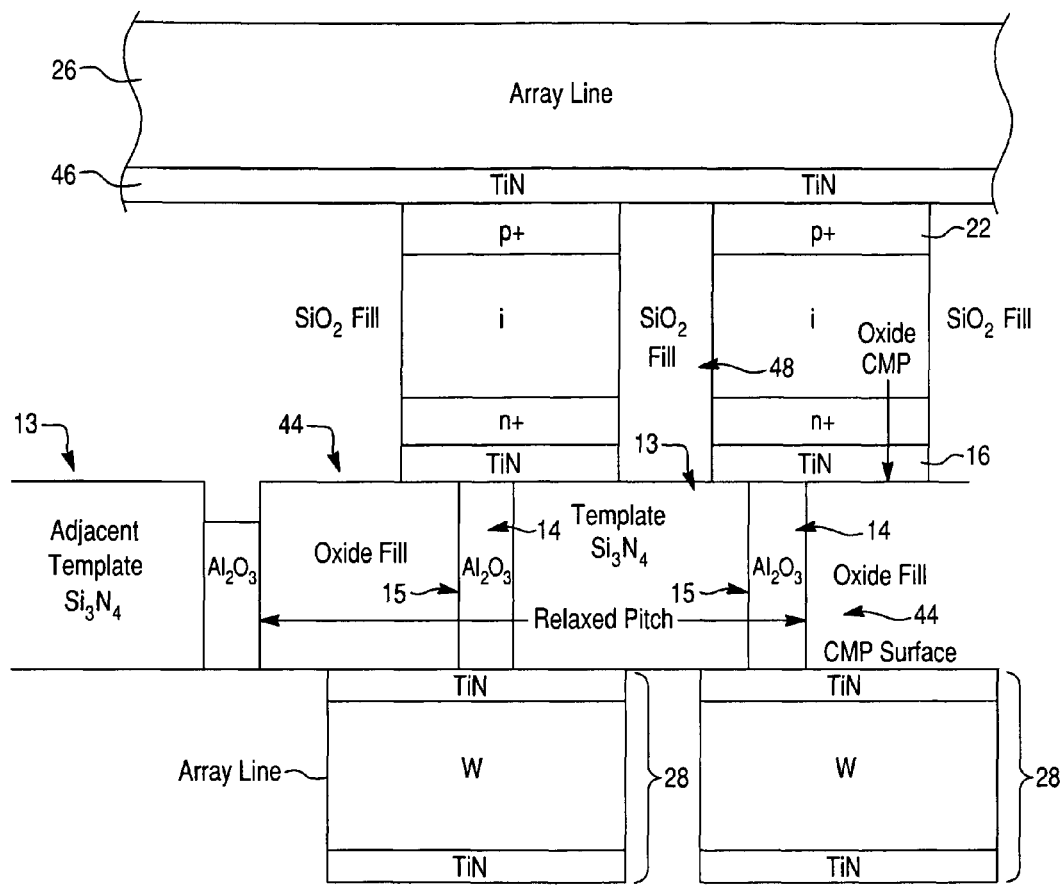

In another embodiment shown in the side and top views of FIGS. 6A and 6B, respectively, the insulating structure 13 can comprise insulating rail shaped structures 13. The rails may be formed by patterning an insulating layer, such as silicon oxide or nitride into insulating structure rails 13. The rails 13 may extend in the same direction as lower electrodes 28 (such as TiN/W/TiN electrodes for example). Preferably, the rails 13 are offset from the electrodes 28 such that sidewalls 15 of each rail 13 are located over the upper surfaces of adjacent electrodes 28. The resistivity switching element 14 is then formed on the sidewalls 15 of the rails 13. Thus, the bottom electrodes 28 are exposed between adjacent rails 13. Since the rails 13 are partially misaligned with the electrodes 28 and the diodes 22, this allows the resistivity switching element 14 to be located in contact with a respective underlying electrode 28 and a respective overlying diode 22. For example, element 14 may be formed by depositing a metal oxide layer over the rails 13 and then planarizing the metal oxide layer. The metal oxide layer may be recessed below the upper surface of the rails where there are no diodes 22 formed over the metal layer. The space between the rails 13 may be filled with an insulating filler material 44, such as silicon oxide, followed by CMP or other planarization. Likewise, the space between the diodes 22 may also be filled with the planarized filler material 48.

In another alternative embodiment shown in FIG. 7, the memory device can be formed by forming at least one diode 22 over the bottom electrode 28. Subsequently, the barrier layer 16 and the insulating structure 13, such as a cylindrical pillar structure 13, are formed over the diode. The resistivity switching element 14 is formed on the sidewall 15 of the structure 13.

The structure 13 may be formed by forming a hard mask pattern layer over an insulating template layer. The hard mask layer can comprise tungsten or amorphous carbon or other material. The template layer can be selectively removed by any suitable method, such as isotropic etching, using the hard mask pattern as a mask to undercut the hard mask pattern. As a result, the width of the template layer is reduced, and at least one insulating pillar is formed from the template layer. This forms a "mushroom" shape of an insulating structure 13 pillar stem covered with a larger diameter hard mask cap.

Resistivity switching material, such as a metal oxide layer, is then subsequently deposited over a sidewall of the insulating structure 13 pillar and on the hard mask cap by any suitable methods, such as for example atomic layer deposition. The semiconductor diode layer(s) (and optionally the barrier layer 16) can be selectively etched using the hard mask pattern as a mask to form at least one pillar diode steering element (and optionally a patterned barrier 16). The hard mask pattern layer can be optionally removed before the upper electrode 26 is formed contact with the resistivity switching element 14 or the hard mask may be retained as part of the upper electrode 26 if the hard mask is electrically conductive. Thus, in this structure, the diode has the same diameter as the hard mask pattern, while the insulating structure 13 has a smaller diameter (or width) than the diode due to the isotropic etching and undercutting. This allows the edge of the resistivity switching element 14 to directly or indirectly electrically contact the diode 22 below structure 13 and to directly or indirectly electrically contact the upper electrode 26 located above structure 13.

The memory cell of the embodiments of the invention may comprise a one-time programmable (OTP) or re-writable nonvolatile memory cell, and may be selected from at least one of antifuse, fuse, diode and antifuse arranged in a series, polysilicon memory effect cell, metal oxide memory, switchable complex metal oxide, carbon nanotube memory, graphene or other carbon switchable resistance material, phase change material memory, conductive bridge element, or switchable polymer memory.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of first features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation. Many modifications and variations of the invention are possible in light of the above teachings. Therefore, within the scope of the appended claims, the invention may be practiced other than as specifically described.

What is claimed:

1. A memory device, comprising:
   a first conductive electrode;
   an insulating structure;
   a resistivity switching element located on a sidewall of the insulating structure;
   a second conductive electrode located over the resistivity switching element; and
   a steering element located in series with the resistivity switching element between the first conductive electrode and the second conductive electrode;
   wherein a height of the resistivity switching element in a first direction from the first conductive electrode to the second conductive electrode is greater than a thickness of the resistivity switching element in second direction perpendicular to the first direction,
   wherein the insulating structure comprises a plurality of insulating rails, and the resistivity switching element is located on the sidewall of at least one insulating rail and in contact with the first conductive electrode exposed between adjacent rails,
   wherein a space between the plurality of insulating rails is filled with an insulating filler material and each insulating rail is partially misaligned with the first conductive electrode and the steering element such that the resistivity switching element is located in contact with the first conductive electrode and the steering element.

2. The device of claim 1, wherein the steering element comprises a diode located above the resistivity switching element.

3. The device of claim 1, wherein the steering element comprises a diode located below the resistivity switching element.

4. The device of claim 1, wherein the steering element comprises a pillar shaped p-i-n diode separated from the resistivity switching element by a conductive barrier layer.

5. The device of claim 1, wherein the resistivity switching element is a metal oxide layer located on a sidewall of the insulating structure.

6. The device of claim 1, wherein the resistivity switching element is selected from an antifuse dielectric, a fuse, a polysilicon memory effect material, a metal oxide or switchable complex metal oxide material, a carbon nanotube material, a grapheme switchable resistance material, carbon resistivity switching material, a phase change material, a conductive bridge element, an electrolyte switching material, or a switchable polymer material.

7. The device of claim 1, wherein:
   the insulating structure comprises a trench in an insulating layer; and
   the resistivity switching element is located on the sidewall of the trench in the insulating layer and in contact with the first conductive electrode exposed on a bottom of the trench in the insulating layer.

8. The device of claim 1, wherein the resistivity switching element has height greater than 10 nm and a thickness less than 10 nm.

* * * * *